US007248060B2

(12) United States Patent
Kim et al.

(10) Patent No.: US 7,248,060 B2
(45) Date of Patent: Jul. 24, 2007

(54) TEST APPARATUS FOR EVALUATING ELECTRICAL PROPERTIES OF LIQUID TONER AND TEST METHOD FOR THE SAME

(75) Inventors: Jung-wook Kim, Yongin-si (KR); Ki-won Seok, Suwon-si (KR); Kyung-yol Yon, Seongnam-si (KR); Deuck-woo Jang, Seongnam-si (KR); Hae-ree Joo, Seoul (KR); Min-young Cheong, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/216,103

(22) Filed: Sep. 1, 2005

(65) Prior Publication Data

US 2006/0049837 A1 Mar. 9, 2006

(30) Foreign Application Priority Data

Sep. 3, 2004 (KR) ...................... 10-2004-0070254

(51) Int. Cl.
*G01R 27/26* (2006.01)

(52) U.S. Cl. ........................................ 324/663; 399/57

(58) Field of Classification Search ................ 324/663; 399/168, 57
See application file for complete search history.

(56) References Cited

U.S. PATENT DOCUMENTS

| | | | | |
|---|---|---|---|---|
| 6,131,002 A * | 10/2000 | Gibson et al. | ................ | 399/57 |
| 6,535,700 B1 * | 3/2003 | Caruthers | .................... | 399/57 |
| 2004/0240897 A1 * | 12/2004 | Chou et al. | .................. | 399/29 |

FOREIGN PATENT DOCUMENTS

| | | |
|---|---|---|
| JP | 09-015982 | 1/1997 |
| JP | 2000-019852 | 1/2000 |
| JP | 2000-056581 | 2/2000 |
| JP | 2000-139476 | 5/2000 |
| KR | 1999-0070956 | 9/1999 |

* cited by examiner

*Primary Examiner*—Walter Benson
(74) *Attorney, Agent, or Firm*—Staas & Halsey LLP

(57) ABSTRACT

A test apparatus to evaluate the electrical properties of a liquid toner in which a printing quality of the liquid toner may be predicted by evaluating the electrical properties of the liquid toner without performing printing. The test apparatus to evaluate the electrical properties of a liquid toner includes a roller, a conductive flat panel positioned below the roller to move a predetermined distance in contact with the roller, a power supply device applying a voltage to the roller and the conductive flat panel, and a voltage tester provided at the rear of the roller to move together with the roller, testing a voltage of the liquid toner arranged on the conductive flat panel.

20 Claims, 5 Drawing Sheets

TEST APPARATUS FOR EVALUATING ELECTRICAL PROPERTIES OF LIQUID TONER AND TEST METHOD FOR THE SAME

CROSS-REFERENCE TO RELATED APPLICATIONS

This application claims benefit under 35 U.S.C. § 119 from Korean Patent Application No. 2004-70254, filed on Sep. 3, 2004, the disclosure of which is incorporated herein by reference.

BACKGROUND OF THE INVENTION

1. Field of the Invention

The present invention relates to a liquid toner used for an image forming apparatus. More particularly, the present invention relates to a test apparatus to evaluate electrical properties of a liquid toner and a test method for the same in which electrical properties of the liquid toner may be evaluated without printing with the liquid toner using an image forming apparatus.

2. Description of the Related Art

Generally, a wet image forming apparatus based on a liquid toner has several advantages in that it can realize high resolution image because toner particles are small. Additionally, high-speed printing is possible, and the printing cost per page is inexpensive because a small amount of toner is required.

The liquid toner used for a wet laser printer is made by dispersing toner particles made of additives, such as a high polymer resin, a pigment, a charge control agent, and a dispersing adjuvant, in a solvent, i.e., a hydrocarbon based liquid carrier. In this case, the liquid toner contains solid components, such as the high polymer resin, the pigment, the charge control agent, and the dispersing adjuvant, within the range of 10% by weight and the solvent components within the range of 90% by weight.

FIG. 1 illustrates a scheme of a wet image forming apparatus that performs printing using the aforementioned liquid toner. Referring to FIG. 1, the liquid toner is transferred on a paper P by a transfer roller 40 through a transfer belt 30 after a developing device 10 develops an electrostatic latent image of a photo-resist body 20. The paper P, on which toner particles are transferred, contains solvent components and solid components. The solvent components are volatilized and the solid components are hardened while passing through a fixing portion 50 of high temperature, thus forming images on the paper P. In FIG. 1, the wet image forming apparatus includes four developing devices 10 to realize color images. A reference numeral 31 denotes a cleaning means that cleans a toner remaining in the transfer belt 30. The wet image forming apparatus may be provided in such a manner that the liquid toner is directly transferred on the paper P from the photo-resist body 20 without utilizing the transfer belt 30.

In the aforementioned wet image forming apparatus, the quality of final images on the paper, i.e., the printing quality, depends on the electrical properties of the liquid toner. Therefore, the quality of the images to be printed on the paper may be predicted by evaluating the electrical properties of the liquid toner. Until now, the charge amount per unit weight of toner particles, i.e., q/m(μC/g), has been tested to evaluate the electrical properties of the liquid toner. In this case, q/m can explain the electrical properties of the liquid toner at the transfer operation T0 (see FIG. 1) from the developing device 10 to the photo-resist body 20, but cannot explain those at the transfer operation T1 from the photo-resist body 20 to the transfer belt 30 and the transfer operation T2 from the transfer belt 30 to the paper P through the transfer roller 40. Therefore, the printing had to be performed by an image forming apparatus with a special liquid toner, so that the electrical properties of the liquid toner that affect the printing quality can be evaluated by referring to the printing result.

As described above, the image forming apparatus is required to evaluate the printing quality if printing is performed with a special liquid toner. In this case, problems occur in that the inconvenient operation is required, and significant time and cost are required to evaluate the printing quality.

SUMMARY OF THE INVENTION

Accordingly, the present invention is directed to a test apparatus to evaluate electrical properties of a liquid toner and a test method for the same that substantially obviates one or more problems due to limitations and disadvantages of the related art.

The present invention provides a test apparatus to evaluate electrical properties of a liquid toner in which a printing quality of the liquid toner may be evaluated without using an image forming apparatus.

The present invention also provides a test method to evaluate the electrical properties of a liquid toner in which the printing quality of the liquid toner may be evaluated without using an image forming apparatus.

To achieve these and other advantages, and in accordance with the purpose of the invention, as embodied and broadly described herein, a test apparatus to evaluate electrical properties of a liquid toner includes a conductive flat panel on which the liquid toner is arranged, a roller arranged on the conductive flat panel to move a predetermined distance in contact with the conductive flat panel, a power supply device applying a voltage to the roller and the conductive flat panel, and a voltage tester at the rear of the roller to move together with the roller, testing a voltage of the liquid toner arranged on the conductive flat panel.

The test apparatus further includes a jig moving the roller a predetermined distance on the conductive flat panel.

Generally, the voltage tester tests a surface potential change, i.e., the voltage change of the liquid toner planarized, i.e., flattened, by the roller. Also, the voltage tester outputs the voltage change value to a graph, or it interfaces with a computer to store the tested voltage change value.

Typically, the roller is a developing roller of an image forming apparatus based on the liquid toner.

In another aspect of the present invention, a test apparatus to evaluate the electrical properties of a liquid toner includes a conductive flat panel on which the liquid toner is arranged, a developing roller arranged in contact with the conductive flat panel, a moving means rotatably moving the developing roller a predetermined distance in parallel to the conductive flat panel, a power supply device applying a voltage to the developing roller and the conductive flat panel, and a voltage tester provided at the rear of the developing roller to move together with the developing roller, testing a voltage of the liquid toner planarized by the developing roller on the conductive flat panel.

The moving means includes a driving portion moving the developing roller and a guide portion guiding the developing roller to rotatably move.

Generally, the moving means is controlled by a computer, and the voltage tested by the voltage tester is stored in the computer.

In other aspect of the present invention, a test method to evaluate the electrical properties of a liquid toner includes arranging the liquid toner on a conductive flat panel, planarizing the liquid toner using a roller to which a voltage is applied, and testing a voltage change of the planarized liquid toner.

Typically, a volume of about 1 ml of the liquid toner is arranged on the conductive flat panel.

Generally, the roller is a developing roller of an image forming apparatus based on the liquid toner.

In the aforementioned test apparatus to evaluate the electrical properties of a liquid toner according to the present invention, since the electrical properties of the liquid toner may be evaluated without testing the printing quality by performing printing using an image forming apparatus, it is convenient to evaluate the liquid toner, and the time and cost required to evaluate the liquid toner are reduced.

In the present invention, since the image forming apparatus is not required, the test method to evaluate the electrical properties of a liquid toner may be provided, in which the time and cost required to evaluate the liquid toner are reduced.

Additional aspects and/or advantages of the invention will be set forth in part in the description which follows and, in part, will be apparent from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
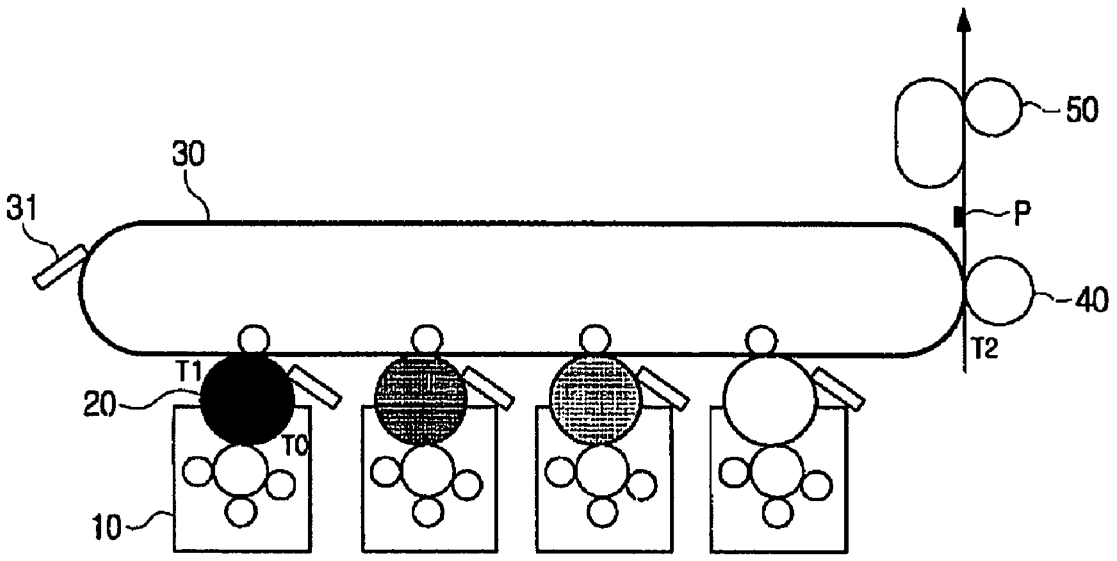
FIG. 1 (PRIOR ART)
FIG. 1 is a scheme illustrating an example of an image forming apparatus based on a liquid toner.

Reference will now be made in detail to the embodiments of the present invention, examples of which are illustrated in the accompanying drawings, wherein like reference numerals refer to the like elements throughout. The embodiments are described below to explain the present invention by referring to the figures.

Figure 2:
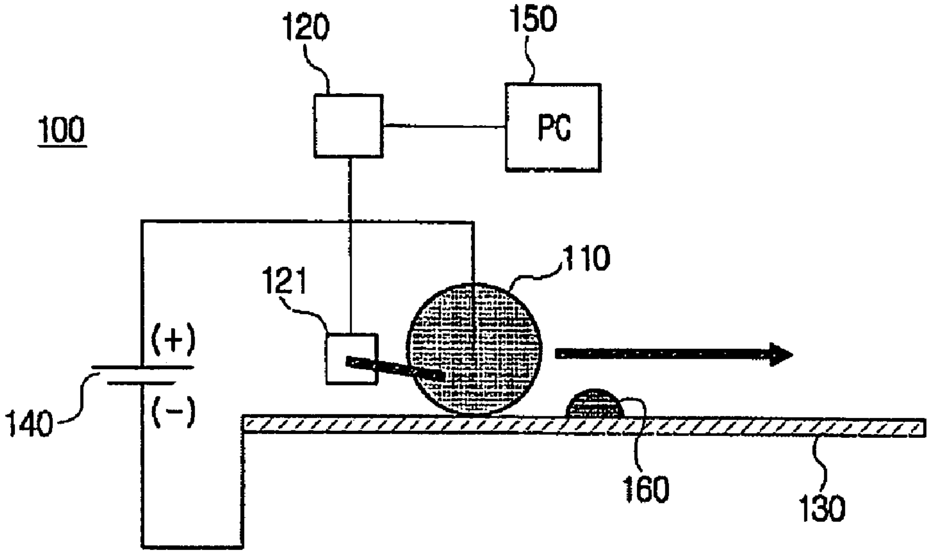
FIG. 2 is a scheme illustrating a test apparatus to evaluate the electrical properties of a liquid toner according to an embodiment of the present invention.

Referring to FIG. 2, a test apparatus 100 to evaluate the electrical properties of a liquid toner includes a roller 110, a conductive flat panel 130, a power supply device 140, and a voltage tester 120.

Figure 3:
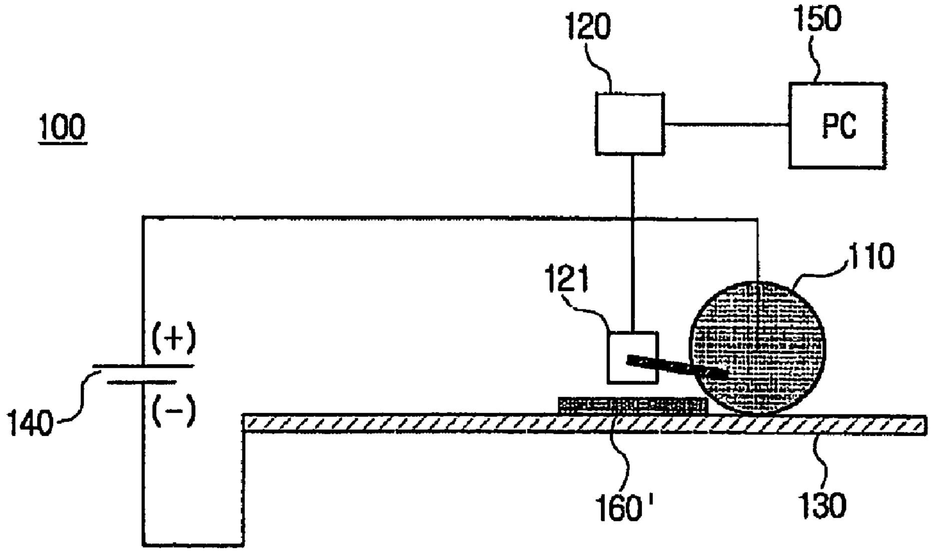
FIG. 3 illustrates the state that a voltage of a liquid toner is tested by a test apparatus to evaluate the electrical properties of a liquid toner shown in FIG. 2.

The roller 110 planarizes a liquid toner 160 arranged on the conductive flat panel 130 and moves a predetermined distance on the conductive flat panel 130 while maintaining contact with the conductive flat panel 130. At this time, the roller 110 moves while rotating. The roller 110 continues to move when a probe 121 of the voltage tester 120 is positioned above a liquid toner 160' planarized by the roller 110 (see FIG. 3). Generally, a movable jig (not shown) is provided in the roller 110. The movable jig moves the roller 110 forward and backward using a certain force while maintaining contact with the conductive flat panel 130. Further, a developing roller of an image forming apparatus based on the liquid toner 160 is typically used as the roller 110.

The conductive flat panel 130 is positioned below the roller 110 and has a width and a length that supports the motion of the roller 110. Generally, the conductive flat panel 130 is made of steel, or stainless steel.

The power supply device 140 applies a certain voltage to the roller 110 and the conductive flat panel 130. A power supply, for example, model 605A by TREK, which applies a direct current voltage, is used as the power supply device 140, so that a cathode (−) is connected to the conductive flat panel 130 while an anode (+) is connected to the roller 110.

The voltage tester 120 tests a voltage of the liquid toner 160' planarized by the roller 110. The probe 121 of the voltage tester 120 is provided at the rear of the roller 110 to move together with the roller 110. In this case, a surface electrometer is generally used as the voltage tester 120. For a precise test, the surface electrometer tests the surface potential in a state that it is not in contact with the liquid toner 160'. An example of the surface electrometer includes model 370 by TREK. A voltage tested by the voltage tester 120 may be displayed in an analog mode to observe its change with the naked eye. Typically, the voltage is displayed in a digital mode to be output in a graph. To this end, a measuring instrument provided with a floater is used, or the measuring instrument is connected to a computer 150 to store a measured value in the computer 150 and output the value in a graph.

The operation of the aforementioned test apparatus 100 to evaluate the electrical properties of the liquid toner will now be described.

First, the liquid toner 160 is arranged on the conductive flat panel 130 at the front of the roller 110. At this time, it is preferable that a volume of about 1 ml of the liquid toner 160 is dropped on the conductive flat panel 130. Next, the power supply, whose anode (+) is connected to the roller 110 and whose cathode (−) is connected to the conductive flat panel 130, is turned on. The probe 121 provided at the rear of the roller 110 is pushed at a predetermined force by the movable jig (not shown) in a state that the voltage is applied to the roller 110 (see FIG. 3). The probe 121 continues to be pushed until it is positioned on the middle portion of the liquid toner 160' that has been planarized by the roller 110. Then, the surface potential of the liquid toner 160' is tested by the voltage tester 120. The voltage tested by the voltage tester 120 is stored in the computer 150 in real time. Afterwards, a graph of the change of the tested voltage of the liquid toner 160' may be obtained through the computer 150. A maximum voltage applied to the liquid toner 160' and the time taken to reach 0 V from 0 V through the maximum voltage may be tested as indicated in the graph.

Figure 6:
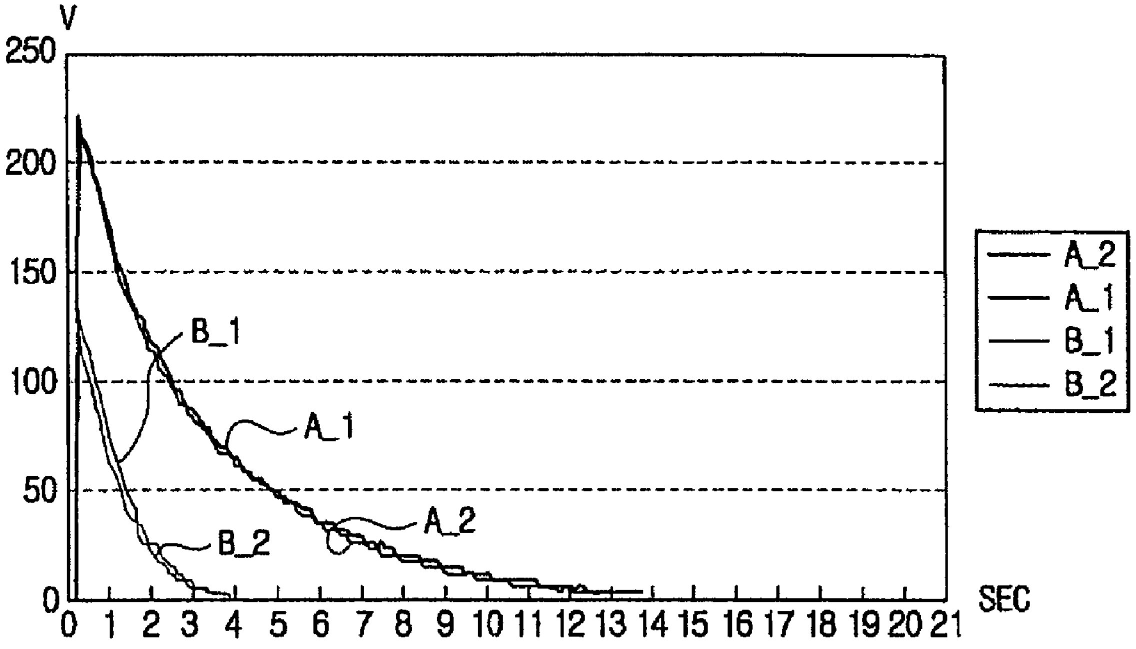
FIG. 6 is a graph illustrating a voltage change of a liquid toner tested by a test apparatus to evaluate the electrical properties of a liquid toner according to an embodiment of the present invention.

Two liquid toners, a liquid toner with a known printing quality (hereinafter, referred to as "toner A") and a liquid toner with an unknown printing quality (hereinafter, referred to as "toner B") have been tested by an embodiment of the aforementioned test apparatus 100. The graph of the tested result is shown in FIG. 6. In FIG. 6, graphs A_1 and A_2 are the test results of the toner A tested two times, while graphs B_1 and B_2 are the test results of the toner B tested two times. Referring to the graphs, it is noted that the maximum voltage of the toner B is relatively smaller than that of the toner A and the time taken to become 0 V at the toner B is relatively faster than that of the toner A. It could be predicted from the above results that the charge efficiency required when the toner B is developed in the image forming apparatus cannot be obtained. Actually, the printing result of the toner B indicates an image density that is lower than that of the toner A by 0.4 to 0.5.

Therefore, the printing quality of the output materials printed with a special liquid toner tested by the test apparatus of an embodiment of the present invention may be evaluated from the above results. In more detail, with respect to the toner A with a known print quality, the electrical properties such as the required maximum voltage and the time for the reduction to 0 V, are tested using the test apparatus. Likewise, the electrical properties of the toner B with the unknown print quality are also tested. Afterwards, the maximum voltage and the time taken to be 0 V of the toner A are compared with those of the toner B. As a result of the comparison, it could be determined that the printing quality of the toner B is less effective than that of the toner A if the maximum voltage and the time taken to become 0 V of the toner B are smaller than those of the toner A. On the other hand, it could be determined that the printing quality of the toner B is more effective than that of the toner A if the maximum voltage and the time taken to become 0 V of the toner B are greater than those of the toner A.

Figure 4:
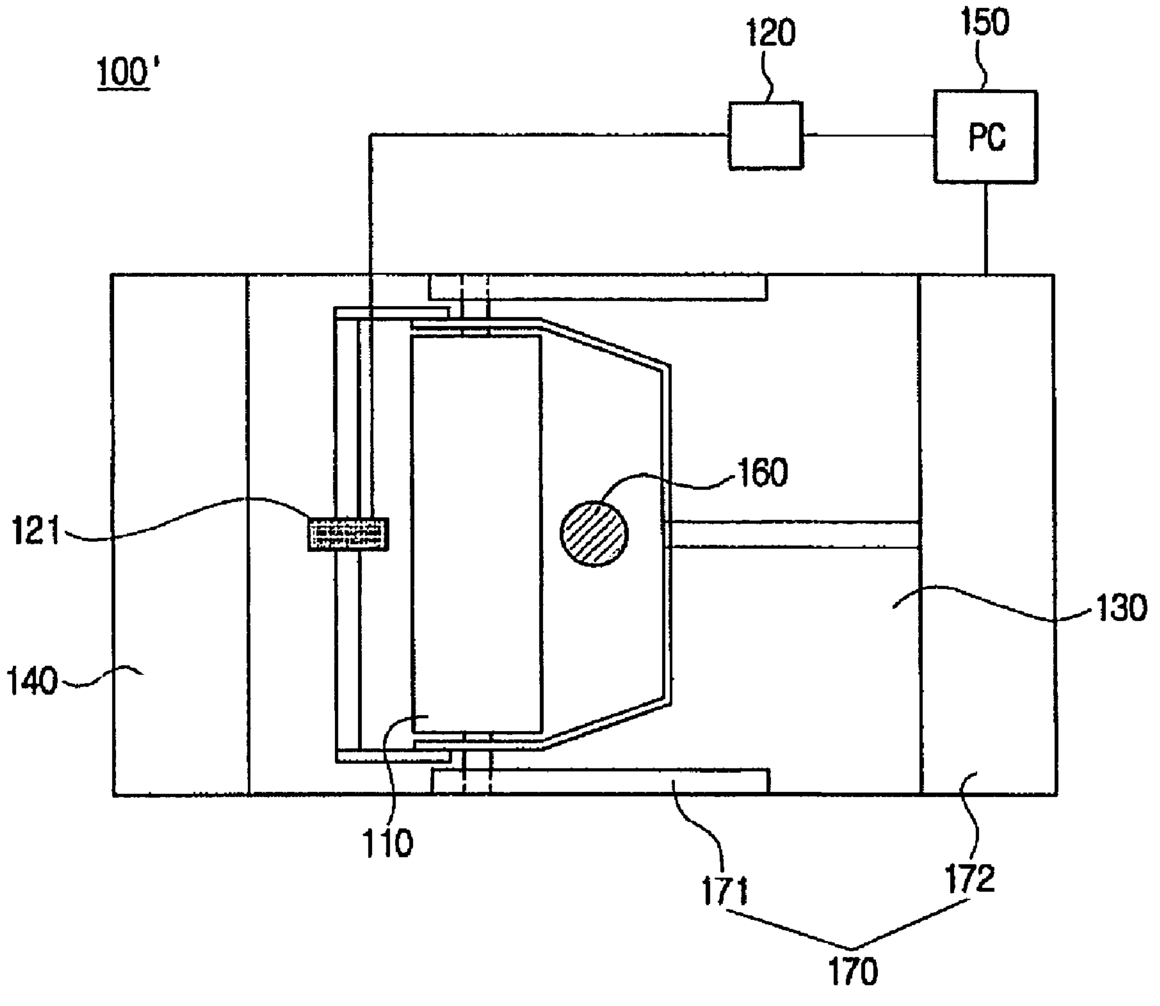
FIG. 4 is a plan view illustrating a test apparatus to evaluate the electrical properties of a liquid toner according to an embodiment of the present invention.
Figure 5:
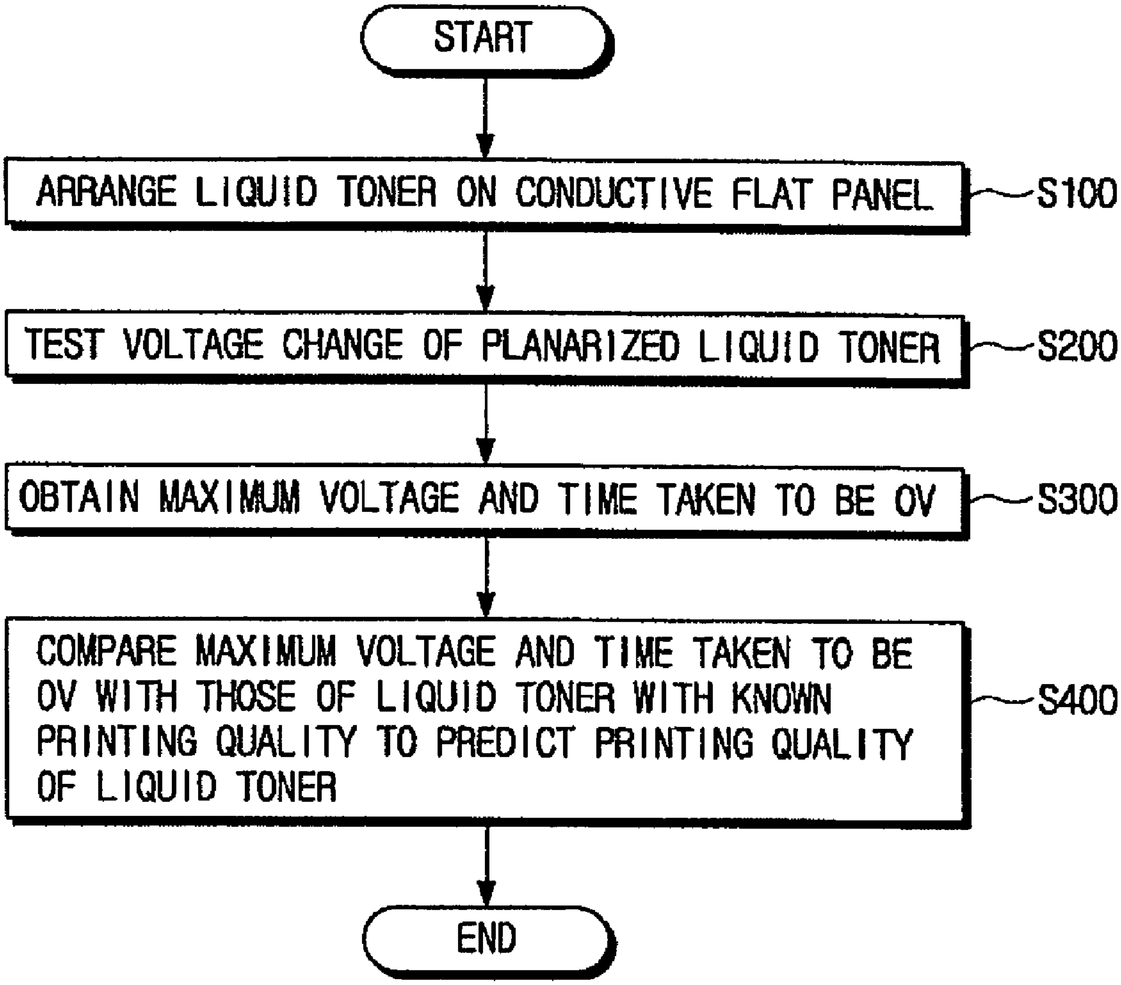
FIG. 5 is a flow chart illustrating a test method to evaluate the electrical properties of a liquid toner according to an embodiment of the present invention.

Referring to FIG. 4, a test apparatus 100' for evaluating electrical properties of a liquid toner includes a developing roller 110, a conductive flat panel 130, a moving means 170, a power supply device 140, a voltage tester 120, and a computer 150.

The developing roller 110 is positioned on the conductive flat panel 130 and moves a predetermined distance while rotating in contact with the conductive flat panel 130. At this time, a developing roller of the image forming apparatus based on the liquid toner 160 is used as the developing roller 110.

The moving means 170 is provided at one side of the developing roller 110. The moving means 170 includes a driving portion 172 generating power to move the developing roller 110 and a guide portion 171 guiding the developing roller 110 so that the developing roller 110 moves at a predetermined distance on the conductive flat panel 130 while rotating. A pneumatic cylinder or a conversion mechanism such as a motor, a rack and a pinion is used as the driving portion 172. The conversion mechanism converts rotation motion into straight-line motion.

The conductive flat panel 130 is positioned below the developing roller 110 and moves at a predetermined distance in contact with the developing roller 110. The power supply device 140 is positioned to oppose the moving means 170 and applies a voltage to the developing roller 110 and the conductive flat panel 130. The probe 121 is provided at the rear of the developing roller 110 to move together with the developing roller 110 and tests the voltage of the liquid toner 160 arranged on the conductive flat panel 130. The voltage tester 120 is connected to the probe 121. Since the conductive flat panel 130, the power supply device 140, the probe 121, and the voltage tester 120 are the same as those of the test apparatus 100, their detailed description will be omitted.

The computer 150 stores the voltage tested by the voltage tester 120 enabling digital output and outputs the tested voltage to a graph. Also, the computer 150 controls the operation of the moving means 170.

The operation of the aforementioned test apparatus 100' to evaluate the electrical properties of the liquid toner will now be described.

First, the liquid toner 160 is arranged on the conductive flat panel 130 at the front of the roller 110. At this time, it is preferable that the amount of the liquid toner 160 to be tested is a volume of about 1 ml. Subsequently, if the test apparatus 100' is in the 'ON' state with the computer 150, the voltage is applied to the developing roller 110 and the conductive flat panel 130 by the power supply device 140. In this state, the developing roller 110 is moved a predetermined distance by the moving means 170. Then, the probe 121 of the voltage tester 120 is positioned at the middle portion of the liquid toner 160 planarized by the developing roller 110. At this time, the computer 150 stores the voltage change of the surface potential of the liquid toner 160 tested by the probe 121 in real time. If the voltage is completely tested, the tested voltage is output to the graph using an output means of the computer 150.

The printing quality of the liquid toner may be evaluated as described above by obtaining the electrical properties tested from the graph, such as the maximum voltage and the time taken to become 0 V.

Hereinafter, a test method to evaluate the electrical properties of a liquid toner according to an embodiment of the present invention will be described.

First, the liquid toner to be tested is arranged on the conductive flat panel in operation S100. In this case, the amount of the liquid toner to be tested is a volume of about 1 ml.

Subsequently, the liquid toner is planarized using the roller to which the voltage is applied, and the voltage change of the planarized liquid toner is tested in operation S200. At this time, a developing roller of the image forming apparatus based on the liquid toner is typically used as the roller. The voltage change of the liquid toner is generally tested using a surface electrometer. Typically, the surface electrometer stores the tested value in real time after interfacing with the computer using a measuring instrument enabling digital output.

Next, the maximum value and the time taken to reach 0 V from 0 V through the maximum value are obtained from the tested voltage change value of the liquid toner in operation S300.

Finally, the electrical properties of the liquid toner with the unknown printing quality are evaluated by comparing the maximum value and the time taken to become 0 V of the liquid toner with the known printing quality with those of the liquid toner with the unknown printing quality in operation S400. The printing quality is predicted from the evaluated electrical properties.

The foregoing embodiments and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art, the scope of which is defined in the claims and their equivalents.

What is claimed is:

1. A test apparatus to evaluate electrical properties of a liquid toner, comprising:
- a conductive flat panel on which the liquid toner is arranged;
- a roller arranged on the conductive flat panel to roll from a first position to a second position on the conductive flat panel;
- a power supply device applying a voltage to the conductive flat panel; and
- a voltage tester provided at the roller to move together with the roller, testing a voltage of the liquid toner arranged on the conductive flat panel at the first position and at the second position.

2. The test apparatus according to claim 1, further comprising a jig moving the roller the predetermined distance on the conductive flat panel.

3. The test apparatus according to claim 1, wherein the voltage tester tests a voltage change of the liquid toner between the first and second positions.

4. The test apparatus according to claim 3, wherein the voltage tester outputs to a graph, voltage curve information from the first position to the second position.

5. The test apparatus according to claim 3, wherein the voltage tester interfaces with a computer to store the voltage change.

6. The test apparatus according to claim 3, wherein the roller is a developing roller of an image forming apparatus that uses the liquid toner.

7. The test apparatus according to claim 1, wherein the liquid toner is made of a hydrocarbon-based liquid carrier and materials selected from the group consisting of a high polymer resin, a pigment, a charge control agent, and a dispersing adjuvant.

8. A test apparatus to evaluate the electrical properties of a liquid toner, comprising:
- a conductive flat panel on which the liquid toner is arranged;
- a developing roller arranged in contact with the conductive flat panel;
- a moving means rotatably moving the developing roller parallel to the conductive flat panel from a first position to a second position to planarize the liquid toner;
- a power supply device applying a voltage the conductive flat panel; and
- a voltage tester provided at a following portion with respect to a moving direction of the developing roller to move together with the developing roller, testing a voltage of the liquid toner planarized by the developing roller on the conductive flat panel at the first and second positions.

9. The test apparatus according to claim 8, wherein the moving means includes a driving portion moving the developing roller and a guide portion guiding the developing roller to rotatably move.

10. The test apparatus according to claim 9, wherein the moving means is controlled by a computer and the voltage tested by the voltage tester is stored in the computer.

11. A test method to evaluate the electrical properties of a liquid toner, comprising:
- arranging the liquid toner on a conductive flat panel;
- planarizing the liquid toner using a roller-tester to which a voltage is applied;
- testing a voltage change of the planarized liquid toner across the conductive flat panel using the roller-tester,
- wherein the roller-tester obtains a maximum voltage value and a time taken to reach 0 V from the maximum voltage, and compares the maximum voltage value and the time taken to reach 0 V with a maximum voltage value and a time to reach 0 V of a liquid toner with a known printing quality to obtain a voltage change value to predict a printing quality of the liquid toner being evaluated.

12. The test method according to claim 11, wherein the test method is performed using a volume of about 1 ml of the liquid toner that is arranged on the conductive flat panel.

13. The test method according to claim 11, wherein the roller-tester is a developing roller of an image forming apparatus that uses the liquid toner.

14. A test method to evaluate the electrical properties of a test liquid toner, comprising:
- arranging the test liquid toner on a conductive flat panel;
- planarizing the test liquid toner using a roller;
- measuring a voltage of the test liquid toner at points across the conductive flat panel after being planarized;
- obtaining a maximum voltage and a time taken to reach 0 V from 0 V through the maximum voltage from the measured voltage of the test liquid toner; and
- comparing the maximum voltage and the time taken to reach 0 V for the test liquid toner with a maximum voltage and a time taken to reach 0 V for a known liquid toner with a known printing quality to predict a printing quality of the test liquid toner.

15. A test apparatus to evaluate electrical properties of a liquid toner, comprising:
- a conductive flat panel on which the liquid toner is arranged;
- a roller-tester arranged on the conductive flat panel to flatten the liquid toner over a predetermined distance on the conductive flat panel and to test a voltage of the liquid toner flattened by the roller; and
- a power supply supplying a voltage to the roller and the conductive flat panel,
- wherein the roller-tester obtains a maximum voltage value and a time taken to reach 0 V from 0 V through the maximum voltage and compares the maximum voltage value and the time taken to reach 0 V with a maximum voltage value and a time of a liquid toner with a known printing quality to reach 0 V to obtain a voltage change value to predict a printing quality of the liquid toner tested.

16. The test apparatus according to claim 15, further comprising a jig moving the roller the predetermined distance on the conductive flat panel.

17. The test apparatus according to claim 15, wherein the roller-tester outputs to a graph the voltage change value.

18. The test apparatus according to claim 15, wherein the roller-tester interfaces with a computer to store the voltage change value.

19. The test apparatus according to claim 15, wherein the roller-tester includes a developing roller of an image forming apparatus based on the liquid toner.

20. A test apparatus to evaluate the electrical properties of a liquid toner, comprising:
- a conductive flat panel on which the liquid toner is arranged; and
- a roller-tester to planarize the liquid toner on the conductive flat panel, apply a voltage across the planarized liquid toner and test a voltage change of the planarized liquid toner across the conductive flat panel,
- wherein a voltage tested at a first position and a voltage tested at a second position are compared to estimate a printing quality of the liquid toner.

* * * * *